United States Patent [19]
Shingai

[11] Patent Number: 5,950,100
[45] Date of Patent: Sep. 7, 1999

[54] METHOD OF MANUFACTURING SEMICONDUCTOR DEVICE AND APPARATUS FOR THE SAME

[75] Inventor: Tadayuki Shingai, Kumamoto, Japan

[73] Assignee: NEC Corporation, Tokyo, Japan

[21] Appl. No.: 08/655,864

[22] Filed: May 31, 1996

[30] Foreign Application Priority Data

May 31, 1995 [JP] Japan ................................. 7-133681

[51] Int. Cl.⁶ ................................................. H01L 21/44
[52] U.S. Cl. ...................... 438/617; 438/123; 228/180.5
[58] Field of Search ..................... 438/617, 123; 257/784; 228/180.5

[56] References Cited

U.S. PATENT DOCUMENTS

| | | | |
|---|---|---|---|
| 4,678,114 | 7/1987 | Egawa et al. | 228/180.5 |
| 5,045,151 | 9/1991 | Edell | 257/784 |
| 5,396,104 | 3/1995 | Kimura | 257/784 |
| 5,656,830 | 8/1997 | Zechman | 257/784 |

FOREIGN PATENT DOCUMENTS

| | | | |
|---|---|---|---|
| 60-167436 | 8/1985 | Japan . | |
| 62-115731 | 5/1987 | Japan . | |
| 63-283137 | 11/1988 | Japan . | |
| 1-105553 | 4/1989 | Japan . | |
| 4-65840 | 3/1992 | Japan | 228/180.5 |
| 5-102226 | 4/1993 | Japan | 228/180.5 |
| 5-102227 | 4/1993 | Japan | 228/180.5 |
| 5-102228 | 4/1993 | Japan | 228/180.5 |

*Primary Examiner*—Kevin M. Picardat
*Attorney, Agent, or Firm*—Sughrue, Mion, Zinn, MacPeak & Seas, PLLC

[57] ABSTRACT

In an apparatus for manufacturing a semiconductor device, insulator is sprayed to a bonding wire continuously fed from a capillary immediately after a first bonding to coat the bonding wire with the insulator. The spray is stopped immediately before the capillary reaches a second bonding position. Then, a second bonding is performed when the capillary reaches the second bonding position.

7 Claims, 4 Drawing Sheets

5,950,100

METHOD OF MANUFACTURING SEMICONDUCTOR DEVICE AND APPARATUS FOR THE SAME

BACKGROUND OF THE INVENTION

1. Field of the Invention

The present invention relates to a method for manufacturing a semiconductor device and an apparatus for the same, and more particularly, to wire bonding technique used in an assembly process of a semiconductor device.

2. Description of Related Art

In a wire bonding process of an assembly process of a semiconductor device, a semiconductor pellet and the inner leads formed in a lead frame are electrically connected by bonding wires. In a conventional wire bonding process, the following bonding methods are typically employed.

In a first conventional bonding method, a wire covered or coated by insulator is used as bonding wire. The insulator coated wire is constituted of, for example, gold (Au) wire 2 around which an insulation film 9 is coated, as shown in FIGS. 1A and 1B. In the first bonding, a ball formed on the tip portion of bonding wire is thermally pressed and adhered to a semiconductor pellet 3 using a capillary 1, as shown in FIG. 1A. The semiconductor pellet 3 has been adhered to an island 5 formed in the lead frame with Ag paste 4. In the second bonding, the bonding wire which is fed from a thin pore of the capillary 1 is thermally pressed and adhered to an inner lead 6 using the capillary 1, as shown in FIG. 1B. The inner lead 6 has been formed in the lead frame. The semiconductor pellet 3 and the inner lead 6 are electrically connected by above first bonding and second bonding.

In the method, in case of second bonding, if fusion of the insulation film 9 is insufficient, a portion of the insulation film 9 remains between the Au wire and the inner lead. In such a case, there is a problem in that it becomes easy for bonding wire to come off the inner lead.

Next, a second conventional bonding method is described in Japanese Laid Open Patent Disclosure (JP-A-Heil-105553). In this method, a Cu wire 10 is used as bonding wire, as shown in FIG. 2. The first bonding process and the second bonding process are performed in the same manner as in the above first conventional bonding method. After these processes, an oxidation film 11 is formed on the surface of Cu wire 10. According to the method, the short circuit between the bonding wires and the short circuit between the bonding wire and the semiconductor pellet can be avoided because the oxidation film 11 acts as the insulation film.

A third conventional bonding method is described in the above-mentioned reference (JP-A-Heil-105553). In the bonding method, an enamel film 12 is formed in place of the oxidation film 11 in the above second conventional bonding method, as shown in FIG. 3. That is, when the first bonding to an Al pattern 13 of the semiconductor pellet 3 and the second bonding to the inner lead 6 are ended, enamel is applied to the surface of Cu wire 10 such that an enamel film 12 can be formed.

In the above second and third conventional bonding methods, there is a problem in that the manufacturing processes increase since the process for forming the oxidation film or enamel film is required in addition to the wire bonding processes.

SUMMARY OF THE INVENTION

The present invention has, as an object, to provide a method of manufacturing a semiconductor device in which the manufacturing process can be simplified without degrading reliability of bonding between a bonding wire and an inner lead, and an apparatus for the same.

An apparatus for manufacturing a semiconductor device of the present invention, includes a capillary for feeding a bonding wire, a sprayer attached to the capillary, spraying insulator to the bonding wire which is continuously fed from the capillary, and a control unit for controlling the sprayer to start and stop the spray of the insulator.

The apparatus according to the present invention is applied to a nail head bonder. In the apparatus, wires such as an Au wire, Cu wire, Al wire, and the other metal wire on which insulator is not coated can be used as the bonding wire. In first bonding, the ball which is formed at the tip portion of bonding wire is thermally pressed to a semiconductor pellet by moving the capillary. As a result, the bonding wire is adhered to the semiconductor pellet.

The sprayer jets out insulator to the bonding wire fed from the capillary. Thereby, an insulation film is formed on the surface of bonding wire. The range where the insulation film is formed is controlled by a control system. The control system controls the sprayer to start jetting out of the insulator immediately after the first bonding. Therefore, the sprayer starts spray of the insulator from the connection end portion of the bonding wire and continues to blow the insulator to the bonding wire continuously fed from capillary.

Also, the control system controls the sprayer to stop the jetting out of the insulator from the sprayer immediately before the second bonding. Therefore, in the second bonding, the non-coated bonding wire is thermally pressed and adhered to the inner lead using the capillary. The inner lead is a protrusion portion formed at the inside of tiebar of the lead frame. According to the structure, there is no case that a portion of insulation film remains between the bonding wire and the inner lead. Therefore, it is possible to prevent reliability of bonding between the bonding wire and the inner lead from being degraded.

In the apparatus for manufacturing a semiconductor device according to the present invention, the bonding wire is bonded to the semiconductor pellet in the first bonding and bonded to the inner lead in the second bonding. On the contrary, the bonding wire may be bonded to the inner lead in the first bonding and bonded to the semiconductor pellet in the second bonded.

A method of manufacturing a semiconductor device of the present invention, includes the steps of:

bonding a tip portion of a bonding wire to a first pad using a capillary;

spraying insulator to the bonding wire continuously fed fro the capillary;

stopping the spraying of the insulator immediately before the capillary opposes to a second pad; and bonding the bonding wire to the second pad using the capillary.

In the method, the first pad may be a semiconductor pellet and the second pad may be the semiconductor pellet.

DESCRIPTION OF THE PREFERRED EMBODIMENTS

Next, an apparatus for manufacturing a semiconductor device according to an embodiment of the present invention will be described with reference to the accompanying drawings.

Figure 1A:
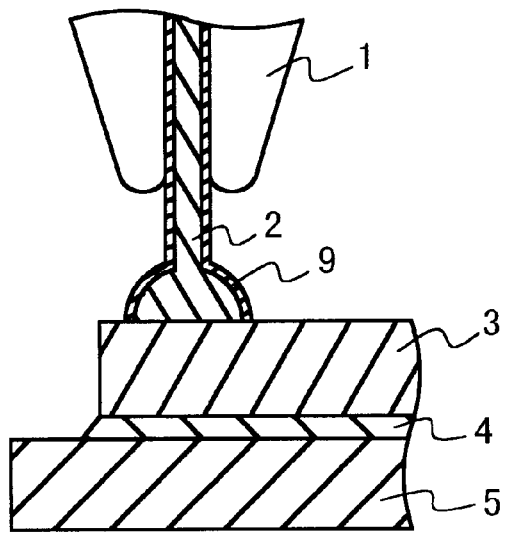
FIGS. 1A and 1B are diagrams to explain the first conventional bonding methods.
Figure 1B:
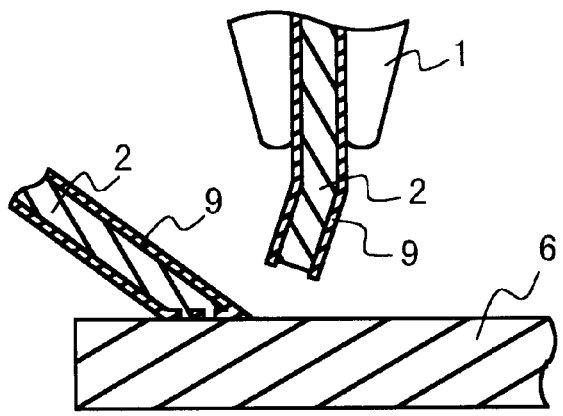
Figure 2:
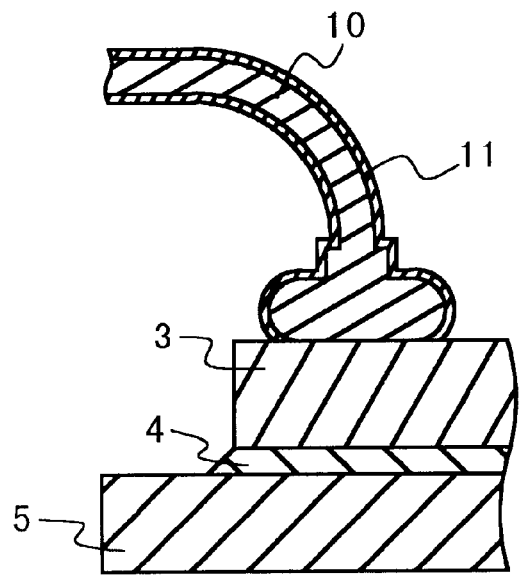
FIG. 2 is a diagram to explain the second conventional bonding method.
Figure 3:
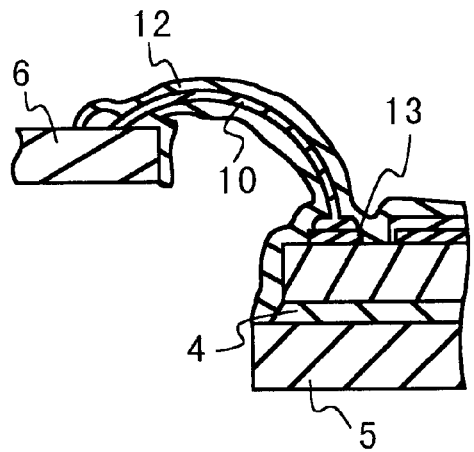
FIG. 3 is a diagram to explain the third conventional bonding method.
Figure 4B:
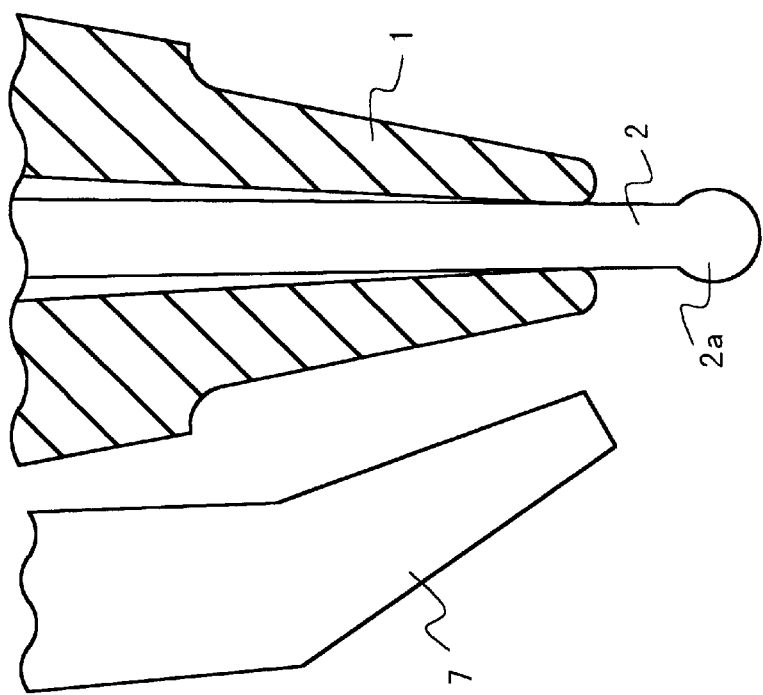
FIGS. 4A and 4B are diagrams showing the structure of an apparatus for manufacturing a semiconductor device according to an embodiment of the present invention.
Figure 4A:
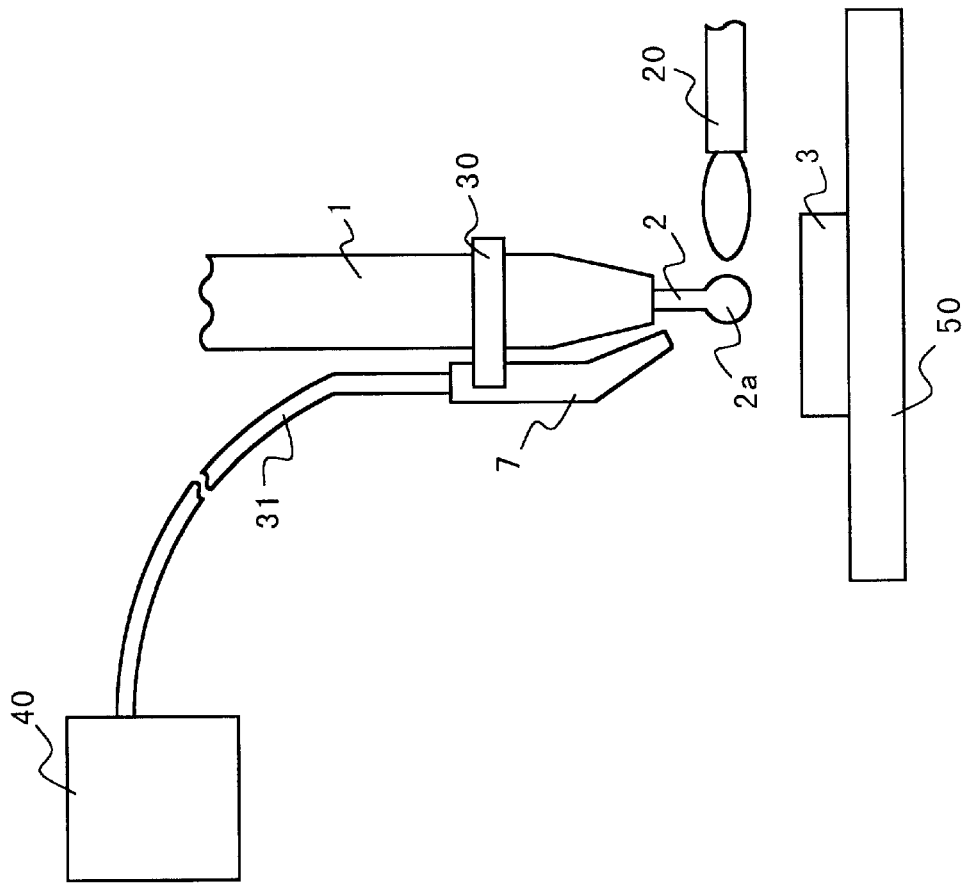

FIGS. 4A and 4B show the structure of the apparatus for manufacturing a semiconductor device according to the embodiment of the present invention. A capillary 1 can be moved in upper and lower directions by a control mechanism (not shown) well known to a skilled person in the art. The capillary 1 is provided with a thin pore at the center to enable a bonding wire 2 to be fed, as shown in FIG. 4B. In the neighborhood of the tip portion of capillary 1, the electric torch 20 is provided to form a ball 2a at the tip portion of bonding wire 2. Also, a sprayer 7 is attached to the capillary 1 by stopper 30. The sprayer 7 has a nozzle arranged to direct to the tip portion of capillary 1. Insulator 8 is supplied to the sprayer 7 through a hose 31 from a control system 40. As the insulator 8, suspended liquid insulator or powdery insulator may be used. The control system 40 controls start of jet of the insulator 8 from the sprayer 7 and stop of the jet of the insulator 8.

An XY table 50 is provided to oppose to the capillary 1. A semiconductor pellet 3 which has been adhered to a lead frame (not shown) is mounted on the XY table 50. A first bonding position and second bonding position are determined by moving the XY table 50 in the X- and Y-directions.

Next, the bonding process using the apparatus for manufacturing a semiconductor device will be described below in detail with reference to FIG. 5A to 5C.

Figure 5A:
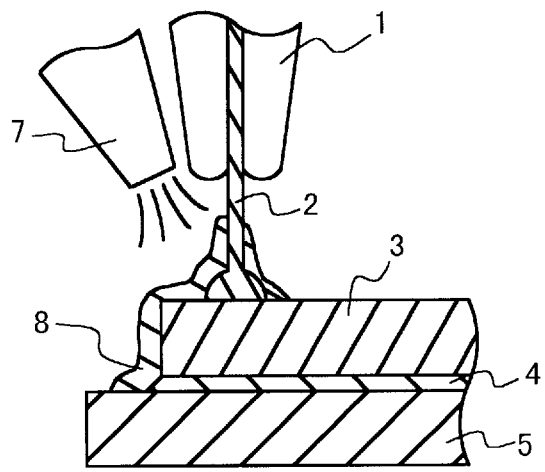
FIGS. 5A, 5B and 5C are diagrams showing the operation of the apparatus for manufacturing the semiconductor device according to the embodiment of the present invention.

In the bonding process, almost, the first bonding is performed as shown in FIG. 5A. The bonding wire 2 is composed of an Au wire, for example. In the first bonding, a ball 2a is first formed at the tip portion of bonding wire 2. The electric torch 20 is used for forming the ball 2a. Then, the ball 2a is thermally pressed and adhered to the semiconductor pellet 3 by moving capillary 1. Thereby, the ball 2a formed at the tip portion of bonding wire 2 is deformed to have the shape of crushed ball (deformed ball) and is coupled to the semiconductor pellet 3.

Next, the control system 40 starts the supply of insulator 8 to the sprayer 7 through hose 31. Thus, the jet of the insulator 8 from the sprayer 7 is started. The sprayer 7 blows the insulator 8 into the crushed ball 2a at first.

Figure 5B:
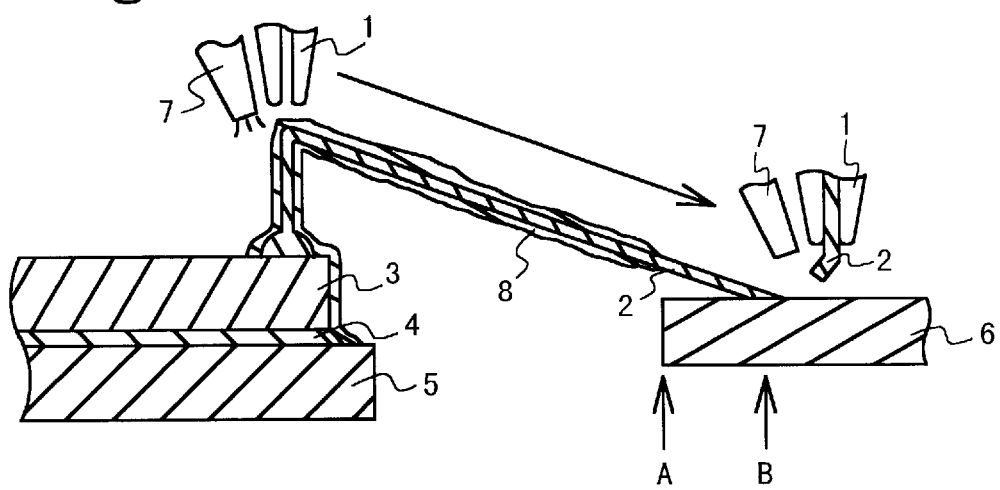

Next, as shown in FIG. 5B, as the XY table 50 moves, the bonding wire 2 is fed through the thin pore of the capillary 1. The insulator 8 is sprayed from the sprayer 7 while the bonding wire 2 is fed. When the tip portion of capillary 1 reaches the edge portion of an inner lead 6 (at the position A of FIG. 5B), the control system 40 stops the supply of insulator 8 to the sprayer 7. Thus, the jet of insulator 8 from the sprayer 7 is stopped. Then, the XY table 50 is moved until a second bonding position on the inner lead 6 (the position B of FIG. 5B) reaches the tip portion of capillary 1. Therefore, the insulator 8 is not applied to the portion of bonding wire 2 which corresponds to a portion from the position A of the inner lead 6 to the position B.

Figure 5C:
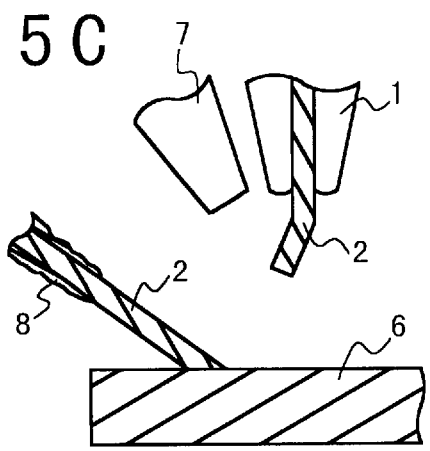

Next, when the tip portion of capillary 1 reaches to the second bonding position as shown in FIG. 5C, the second bonding is performed. Thereafter, the bonding wire 2 is cut. Therefore, the second bonding is performed in the state in which the bonding wire 2 is exposed. In this manner, the semiconductor pellet 3 and the inner lead 6 are connected by the bonding wire 2 coated by the insulator 8.

As described above, according to the present invention, the bonding of the bonding wire to the inner lead can be performed with high reliability since the second bonding is performed with the non-coated bonding wire 2.

Also, the manufacturing process of the semiconductor device can be simplified because the application process of insulator 8 to the surface of bonding wire 2 and the bonding process can be performed in a single step.

Further, the short circuit between the bonding wires and the short circuit between the bonding wire and the semiconductor pellet do not occur in the semiconductor device manufactured by the present invention, because the bonding wire is coated with the insulator.

What is claimed is:

1. An apparatus for manufacturing a semiconductor device, comprising:

a capillary for feeding a bonding wire;

a sprayer attached to said capillary for spraying insulation on said bonding wire; and a control unit for controlling said sprayer to spray insulation over an entire bond formed by said bonding wire only after said bond has been formed.

2. An apparatus according to claim 1, wherein said control unit controls said sprayer to stop the spray of the insulator immediately before a second bonding.

3. An apparatus according to claim 2, wherein said bonding wire is bonded to a semiconductor pellet in said first bonding and to an inner lead in said second bonding.

4. An apparatus according to claim 2, wherein said bonding wire is bonded to an inner lead in said first bonding and to a semiconductor pellet in said second bonding.

5. A method of manufacturing a semiconductor device, comprising the ordered steps of:

bonding a bonding wire to a first pad to form a first bond, said bonding wire being fed through a capillary;

spraying insulation to entirely cover said first bond;

stopping the spray of insulation immediately before said capillary is disposed proximate to a second pad; and bonding said bonding wire to said second pad.

6. A method according to claim 5, wherein said first pad is a semiconductor pellet and said second pad is an inner lead.

7. A method according to claim 5, wherein said first pad is an inner lead and said second pad is a semiconductor pellet.

* * * * *